(12) United States Patent
Choi

(10) Patent No.: US 7,078,935 B2
(45) Date of Patent: Jul. 18, 2006

(54) SIMULTANEOUS BI-DIRECTIONAL TRANSCEIVER

(75) Inventor: Jung-Hwan Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 153 days.

(21) Appl. No.: 10/834,062

(22) Filed: Apr. 29, 2004

(65) Prior Publication Data

US 2005/0030820 A1 Feb. 10, 2005

(30) Foreign Application Priority Data

Aug. 8, 2003 (KR) .................. 10-2003-0055029

(51) Int. Cl.
*H03K 19/0175* (2006.01)
*H03K 19/094* (2006.01)
(52) U.S. Cl. .................. 326/82; 326/86; 327/108
(58) Field of Classification Search .................. 326/21, 326/62, 82, 86, 90; 327/111
See application file for complete search history.

(56) References Cited

U.S. PATENT DOCUMENTS 5,825,819 A * 10/1998 Cogburn .................. 375/257
6,163,290 A * 12/2000 Moreland et al. ........... 341/155

* cited by examiner

*Primary Examiner*—Daniel D. Chang
(74) *Attorney, Agent, or Firm*—Volentine Francos & Whitt, P.L.L.C.

(57) ABSTRACT

A simultaneous bi-directional (SBD) transceiver includes a first, second, third and fourth differential amplifiers, where the third differential amplifier responds to signals input through data transmission channels, and the fourth differential amplifier responds to output signals derived from the first differential amplifier. The first and second differential amplifiers are fully differential amplifiers. A size of a constant current source associated with the second differential amplifier is n (n>1) times that of a constant current source associated with the first differential amplifier. A size of a constant current source associated with the third differential amplifier is m (m>1) times that of a constant current source associated with the fourth differential amplifier.

12 Claims, 6 Drawing Sheets

SIMULTANEOUS BI-DIRECTIONAL TRANSCEIVER

BACKGROUND OF THE INVENTION

1. Field of the Invention

The present invention relates generally to a semiconductor device, and more particularly, to a fully differential simultaneous bi-directional (SBD) transceiver.

A claim of priority is made to Korean Patent Application No. 2003-55029, filed on Aug. 8, 2003, in the Korean Intellectual Property Office, the disclosure of which is hereby incorporated in its entirety by reference.

2. Description of the Related Art

Semiconductor devices such as processors, controllers, and memory devices generally include data transceivers for transmitting and receiving data. These transceivers typically transmit and/or receive data via one dedicated transmission line. Recently, semiconductor devices capable of simultaneously and bi-directionally transmitting and receiving data have been developed. Simultaneous bi-directional (hereinafter, referred to as 'SBD') transceivers are capable of simultaneously transmitting and receiving data during a single clock cycle via the single transmission line.

FIG. 1 generally illustrates an operative combination of two conventional SBD transceivers 10a and 10b connected via a transmission line forming a data transmission channel 16. SBD transceiver 10a includes a data driver 12a and a data receiver 14a. An internal data signal Dout1 to be transmitted is supplied to data driver 12a as an input data signal, and to data receiver 14a as a control signal. An output terminal associated with data driver 12a is connected to an input terminal associated with data receiver 14a.

Data receiver 14a typically receives two reference voltages VrefH and VrefL that are used to compare signal levels. When the voltage level of internal data signal Dout1 'high $(V_H)$', data receiver 14a selects reference voltage VrefH, compares the level of the internal data signal Dout1 to the level of reference voltage VrefH, and outputs a data signal Din1 in accordance with the comparison result. When the level of internal data signal Dout1 is 'low $(V_L)$', data receiver 14a selects reference voltage VrefL, compares the level of the internal data signal Dout1 to the level of reference voltage VrefL, and outputs data signal Din1 in accordance with the comparison result.

SBD transceiver 10b similarly includes a data driver 12b and a data receiver 14b. An internal data signal Dout2 to be transmitted is supplied to data driver 12b as an input data signal and to data receiver 14b as a control signal. An output terminal of data driver 12b is connected to an input terminal of data receiver 14b.

Data receiver 14b operates in like fashion to data receiver 14a by respectively comparing the level of an internal data signal Dout2 to one of the two reference voltages VrefH and VrefL, and outputting a data output signal Din2 in accordance with the comparison.

FIG. 2 shows the relationship between selected input data signals and output data signals associated with the SBD transceivers 10a and 10b shown in FIG. 1. Referring to FIGS. 1 and 2, internal data signal Dout1 is 'high $(V_H)$' during time periods T1, T2, and T5, and internal data signal Dout2 is 'high $(V_H)$' during time periods T1, T3, and T5.

During T1, a voltage $V_{CH}$ apparent on data transmission channel 16 is high (VDDQ). Thus, data receiver 14a compares the voltage $V_{CH}$ on the channel 16 with reference voltage VrefH and outputs the output signal Din1 with a high level $(V_H)$. The data receiver 14b compares voltage $V_{CH}$ on channel 16 with reference voltage VrefH and outputs the output signal Din2 of a high level $(V_H)$.

During T2, voltage $V_{CH}$ on channel 16 is approximately Vmid. Vmid is a generally a voltage level half way between a supply voltage VDDQ and a ground voltage VSS. Thus, data receiver 14a compares voltage $V_{CH}$ on channel 16 with reference voltage VrefH and outputs the output signal Din1 of a low level $(V_L)$. Data receiver 14b compares voltage $V_{CH}$ on channel 16 with reference voltage VrefL and outputs the output signal Din2 of a high level $(V_H)$.

During T3, the voltage $V_{CH}$ on channel 16 is approximately Vmid. Thus, the data receiver 14a compares voltage $V_{CH}$ on channel 16 with reference voltage VrefL and outputs the output signal Din1 of a high level $(V_H)$. Data receiver 14b compares voltage $V_{CH}$ on channel 16 with reference voltage VrefH and outputs the output signal Din2 of a low level $(V_L)$.

The operation of SBD transceivers 10a and 10b during time periods T4 and T5 continues along this same line.

Each of the data drivers 12a and 12b swings between the supply voltage VDDQ and the ground voltage VSS, thus consuming considerable amounts of current. Further, since a swing voltage level for channel 16 must be half the supply voltage VDDQ, the respective sizes of data drivers 12a and 12b can become rather large. As a result, parasitic capacitances associated with the SBD transceivers 10a and 10b, as viewed from the perspective of data transmission channel 16, become significant. Indeed, the delay and signal distortion effects of these parasitic capacitances can impede the transmission of data between SBD transceivers 10a and 10b. This is particularly true as data transmission speeds increase.

SUMMARY OF THE INVENTION

The present invention provides a fully differential simultaneous bi-directional (SBD) transceiver capable of operating at reduced power levels and well adapted to data transmissions at high frequencies.

Thus, in one aspect, the present invention provides a simultaneous bi-directional (SBD) transceiver comprising first, second, third, and fourth differential amplifiers, each having respectively a pair of input terminals, a pair of output terminals, and a constant current source. Where the first pair of input terminals is connected terminal-for-terminal with the second pair of input terminals, the first pair of output terminals is connected terminal-for-terminal with the fourth pair of input terminals, the second pair of output terminals is connected terminal-for terminal with the third pair of input terminals, and the third pair of output terminals is connected terminal-for terminal with the fourth pair of output terminals.

In a related aspect, the present invention provides for an arrangement in which a first current flowing through the second constant current source is "n" times that of a first current flowing through the first constant current source, and a third current flowing through the third constant current source is "m" times that a fourth current flowing through the fourth constant current source, where "n" and "m" are both positive values.

In another aspect, the present invention provides a simultaneous bi-directional (SBD) transceiver comprising: a first differential amplifier, comprising a first constant current source, amplifying a difference between first differential input signals, and outputting first differential output signals; a second differential amplifier, comprising a second constant current source, amplifying a difference between the first differential input signals, and outputting second differential output signals; a third differential amplifier, comprising a third constant current source, and amplifying a difference between signals applied through a pair of input terminals; and, a fourth differential amplifier, comprising a fourth constant current source, and amplifying a difference between the first differential output signals, wherein the second differential output signals are input to the pair of input terminals, and output signals derived from the third differential amplifier overlap output signals derived from the fourth differential amplifier.

In yet another aspect, the present invention provides first and second simultaneous bi-directional (SBD) transceivers connected via a first and second data transmission channels. Each of the first and second SBD transceivers comprises first, second, third and fourth differential amplifiers, each comprising a respective first, second, third and fourth constant current source, wherein first and second differential amplifiers are fully differential amplifiers commonly receiving input signals; wherein the third differential amplifier responds to signals input through the first and second data transmission channels; and, wherein the fourth differential amplifier responds to output signals derived from the first differential amplifier in response to the input signals.

BRIEF DESCRIPTION OF THE DRAWINGS

The above and other aspects and advantages of the present invention will become readily apparent from the description of presently preferred embodiment(s) of the invention with reference to the attached drawings in which.

DETAILED DESCRIPTION OF THE INVENTION

Figure 1:
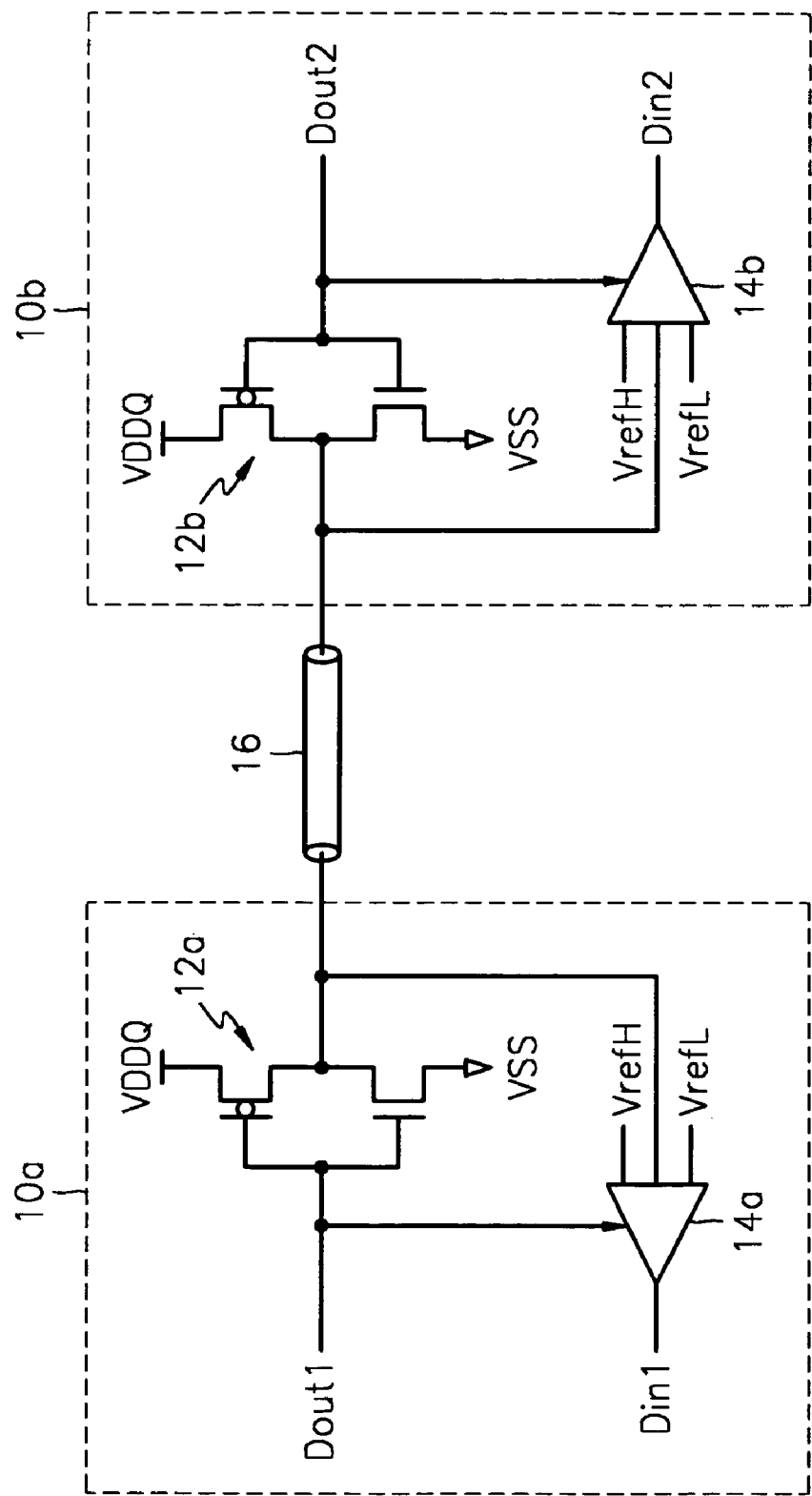
FIG. 1 illustrates a typical combination of two conventional simultaneous bi-directional (SBD) transceivers connected via a data transmission channel.
Figure 2:
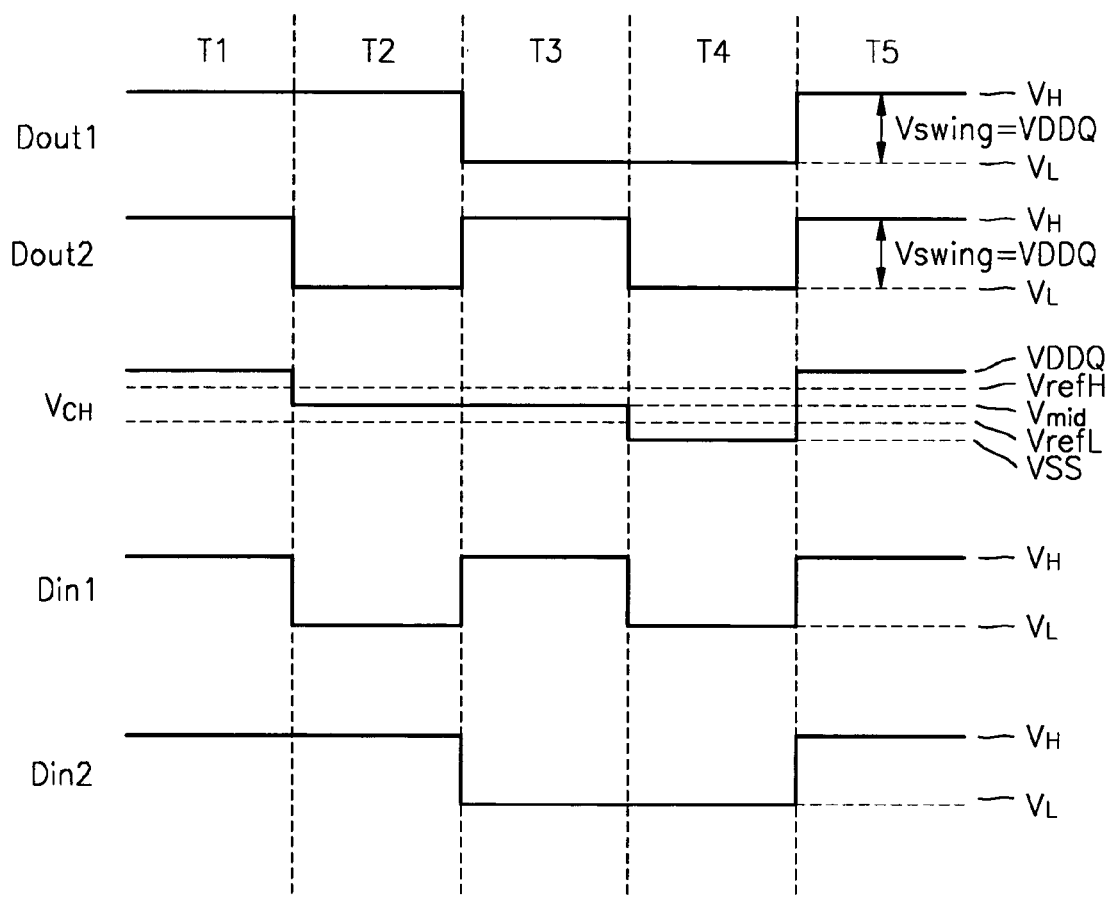
FIG. 2 is a waveform diagram showing the relationship between selected data input and data output signals associated with the SBD transceivers of FIG. 1.

The present invention will now be described in some additional detail within the context of several presently preferred embodiments and with reference to the accompanying drawings. Throughout the drawings, like reference numerals are used to refer to like elements.

Figure 3:
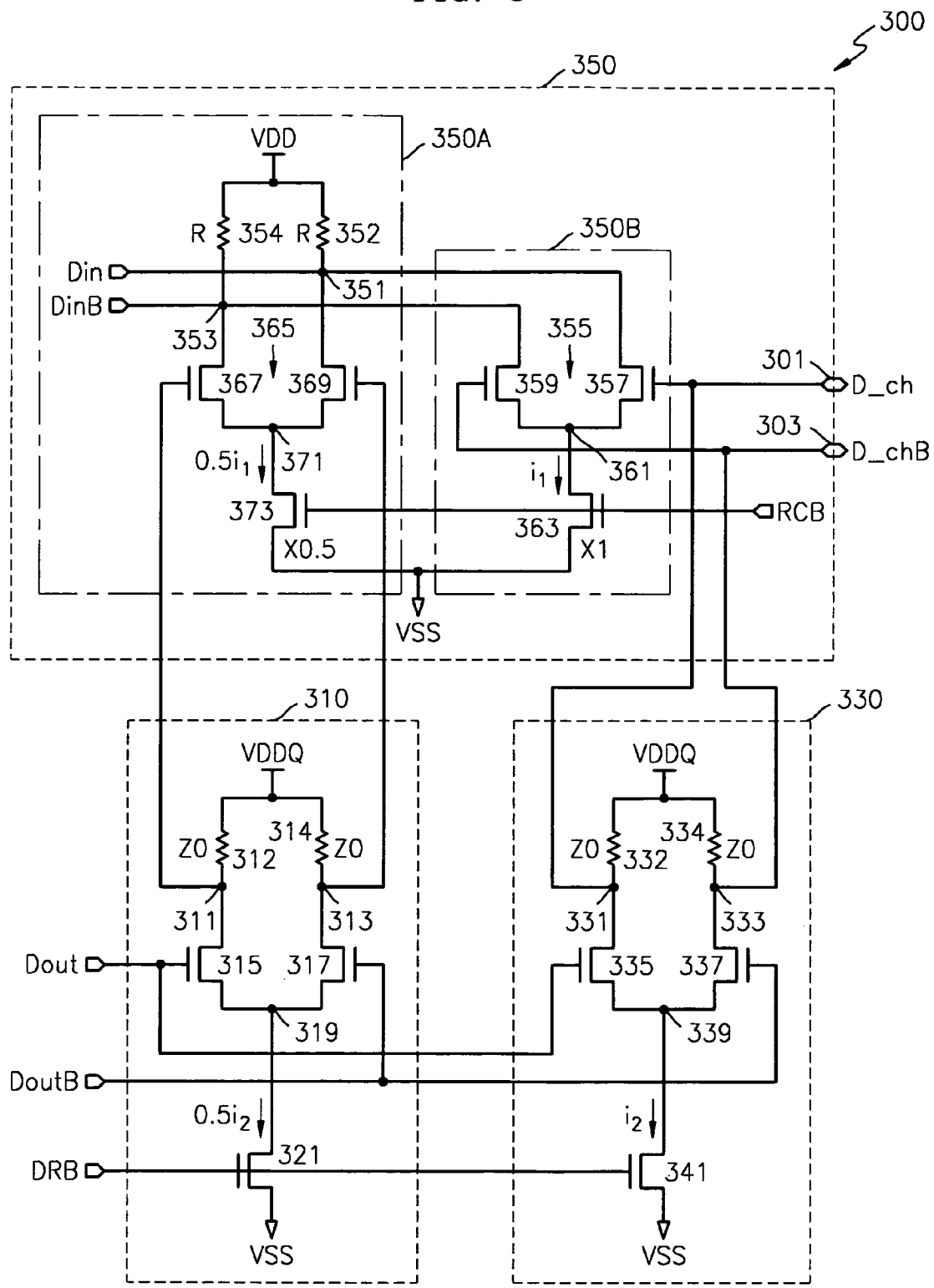
FIG. 3 is a circuit diagram of an SBD transceiver according to one embodiment of the present invention.

FIG. 3 is a circuit diagram of a simultaneous bi-directional (SBD) transceiver according to an embodiment of the present invention. Referring to FIG. 3, a SBD transceiver 300 is a fully differential SBD transceiver. In the illustrated example, SBD transceiver 300 includes first through fourth differential amplifiers 310, 330, 350B, and 350A.

First differential amplifier 310 includes a first differential pair including a first transistor 315 and a second transistor 317, a first constant current source 321, and two load resistors 312 and 314.

First transistor 315 is preferably implemented as an NMOS transistor and is connected between a first node 311 and a second node 319. A first input signal Dout is applied to the gate of first transistor 315.

Second transistor 317 is preferably implemented as an NMOS transistor and is connected between a third node 313 and second node 319. A second input signal DoutB is applied to the gate of second transistor 317.

Here, the first input signal Dout and second input signal DoutB are differential signals. Output signals apparent at first node 311 and third node 313 are differential signals.

First constant current source 321 is preferably implemented as an NMOS transistor and is connected between second node 319 and a ground voltage VSS. A driving bias voltage DRB is applied to the gate of the first constant current source 321. First constant current source 321 generates a first constant bias current ($0.5i_2$) in response to the driving bias voltage DRB. Thus, in this particular embodiment, a driving bias voltage DRB is used within SBD transceiver 300 to effect the transmission of data.

Load resistor 312 is connected between a first supply voltage VDDQ and first node 311, and load resistor 314 is connected between the first supply voltage VDDQ and third node 313. First differential amplifier 310 is typically referred to as a "replica output driver."

Second differential amplifier 330 includes a second differential pair including a third transistor 335 and a fourth transistor 337, a second constant current source 341, and two load resistors 332 and 334.

Third transistor 335 is preferably implemented as an NMOS transistor and is connected between a first node 331 and a second node 339. First input signal Dout is applied to the gate of third transistor 335. (For ease of reference, each similarly construction differential amplifier is said to comprise first, second, and third nodes).

Fourth transistor 337 is preferably implemented as an NMOS transistor and is connected between a third node 333 and second node 339. The second input signal DoutB is applied to the gate of fourth transistor 337. Signals apparent at first node 331 and second node 333 are differential signals.

Second constant current source 341 is preferably implemented as an NMOS transistor and is connected between second node 339 and the ground voltage VSS. The driving bias voltage DRB is applied to the gate of second constant current source 341. Second constant current source 341 generates a second constant bias current ($i_2$) in response to the driving bias voltage DRB.

As presently preferred, the second constant bias current ($i_2$) generated by second constant current source 341 is double the first constant bias current ($0.5i_2$) generated by first constant current source 321. However, by controlling respective transistor channel width ratios and lengths of first constant current source 321 and second constant current source 341, second constant bias current, as selectively generated by second constant current source 341, can be "n times" (where "n" is a real number, preferably greater than 1) the first constant bias current, as selectively generated by the first constant current source 321.

Load resistor 332 is connected between the first supply voltage VDDQ and first node 331, and load resistor 334 is connected between the first supply voltage VDDQ and the third node 333.

As presently preferred, the resistance (Z0) of load resistors 312, 314, 332, and 334 are identical. Second differential amplifier 330 is preferably termed a "main output driver" for SBD transceiver 300.

Third differential amplifier 350B includes a third differential pair 355 including a fifth transistor 359 and a sixth transistor 357, as well as a third constant current source 363. Fifth transistor 359 is preferably implemented as an NMOS transistor and is connected between a first node 353 and a second node 361. A third input signal D_chB input received through a pad 303 is applied to the gate of fifth transistor 359.

Sixth transistor 357 is preferably implemented as an NMOS transistor and is connected between a third node 351 and second node 361. A fourth input signal D_ch input received through a pad 301 is applied to the gate of sixth transistor 357.

Third constant current source 363 is preferably implemented as an NMOS transistor and is connected between third node 361 and the ground voltage VSS. A receiving bias voltage RCB is applied to the gate of third constant current source 363. Third constant current source 363 generates a third constant bias current ($i_1$) in response to receiving bias voltage RCB. Thus, in the illustrated example, receiving bias voltage RCB is used within SBD transceiver 300 to receive data.

Fourth differential amplifier 350A includes a fourth differential pair 365 including a seventh transistor 367 and an eighth transistor 369, a fourth constant current source 373, and two load resistors 352 and 354. The combination of third differential amplifier 350B and the fourth differential amplifier 350A are preferably termed an "input buffer" or "receiver" 350.

Seventh transistor 367 is preferably implemented as an NMOS transistor and is connected between first node 353 and a second node 371. The gate of seventh transistor 367 is connected to first node 311 of first differential amplifier 310.

Eighth transistor 369 is preferably implemented as an NMOS transistor and is connected between third node 351 and second node 371. The gate of eighth transistor 369 is connected to the third node 313 of first differential amplifier 310.

Fourth constant current source 373 is preferably implemented as an NMOS transistor and is connected between second node 371 and the ground voltage VSS. Receiving bias voltage RCB is applied to the gate of fourth constant current source 373. Fourth constant current source 373 generates a fourth constant bias current ($0.5i_1$) in response to receiving bias voltage RCB.

As presently preferred, the third constant bias current generated by third constant current source 363 is double that of the fourth constant bias current generated by fourth constant current source 373. However, by respectively controlling transistor channel width ratios and lengths in third constant current source 363 and fourth constant current source 373, the third constant bias current, as selectively generated by third constant current source 363 can be "n times" (where "n" is a real number, preferably greater than 1) that of the fourth constant bias current, as selectively generated by fourth constant current source 373. The first through fourth constant current sources 321, 341, 363, and 373 are examples of bias current generators.

Load resistor 354 is connected between a second supply voltage VDD and first node 353, and load resistor 352 is connected between the second supply voltage VDD and third node 351.

Figure 4:
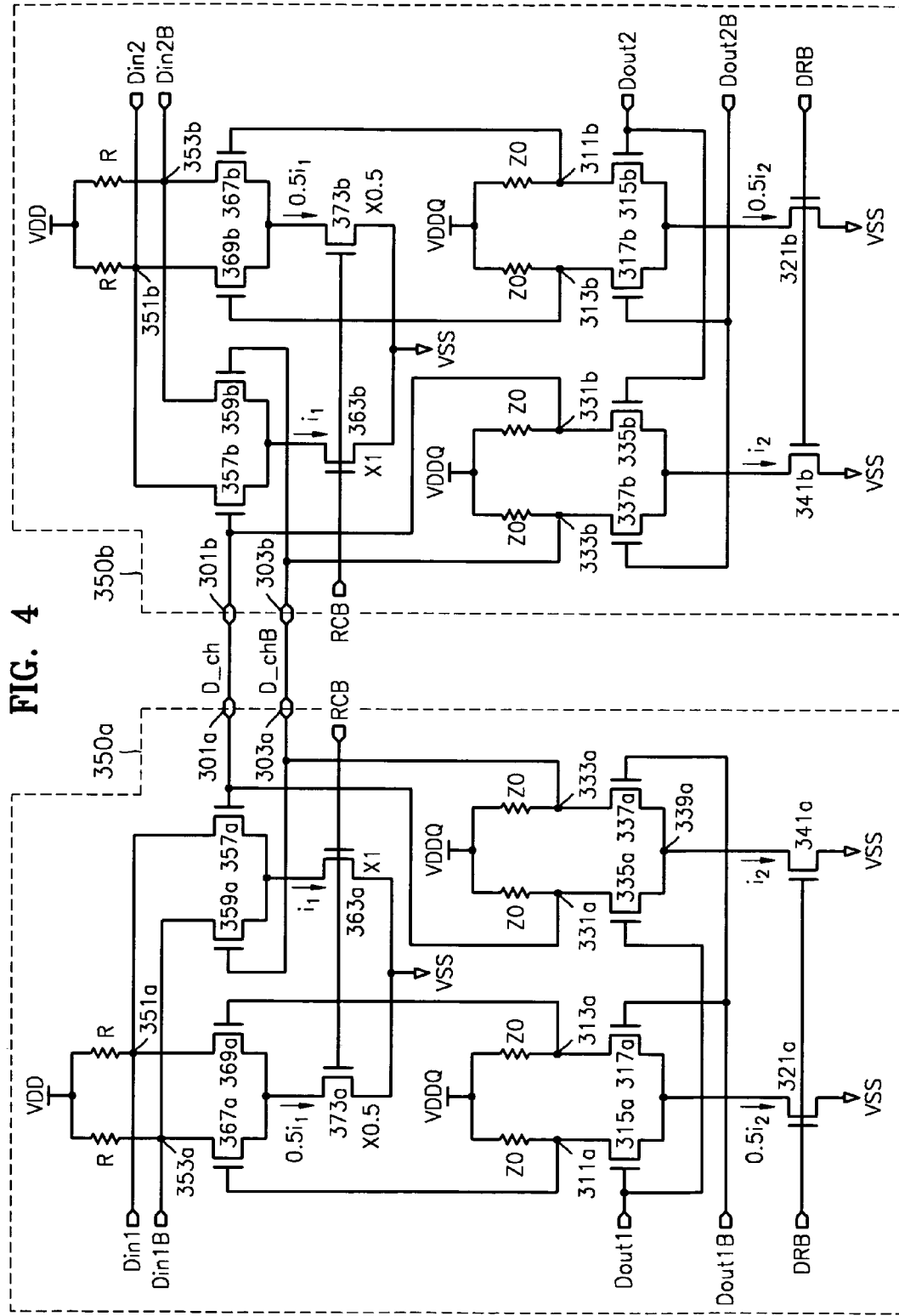
FIG. 4 illustrates two SBD transceivers connected by transmission lines according to another embodiment of the present invention.

FIG. 4 illustrates two SBD transceivers, respectively implemented in accordance with the embodiment of the present invention shown in FIG. 3, connected by transmission lines. Referring to FIG. 4, a first SBD transceiver 350a simultaneously transmits and receives data with a second SBD transceiver 350b via first and second channels, D_ch and D_chB. At this time, it is assumed that driving bias voltage DRB and receiving bias voltage RCB are needed to generate predetermined currents $i_1$ and $i_2$. Thus, NMOS transistors 321a, 341a, 363a, 373a, 321b, 341b, 363b, and 373b are turned on. As presently preferred, the structures of first SBD transceiver 350a and second SBD transceiver 350b are the same.

With these specific implementation assumptions in place for purposes of explanation, the operation of the two SBD transceivers shown in FIG. 4 will now be described. When the data to be output, Dout1 and Dout2, are 'high' (H) and the complementary data to be output, Dout1B and Dout2B, are 'low' (L), the operation of first SBD transceiver 350a and second SBD transceiver 350b proceeds as follows.

Since NMOS transistor 335a is turned on in response to data Dout1 having a high level (H), a voltage at first node 331a is low (L). Thus, a voltage at pad 301a is low (L). However, since NMOS transistor 337a maintains an off state in response to the data Dout1B (L), a voltage at third node 333a is high (H). Thus, a voltage at a pad 303a is high (H).

Since NMOS transistor 335b is turned on in response to data Dout2 (H), a voltage at third node 331b is low (L). Thus, a voltage at a pad 301b is low (L). However, since NMOS transistor 337b maintains an off state in response to the data Dout2B (L), a voltage at first node 333b is high (H). Thus, a voltage at a pad 303b is high (H). Consequently, a voltage on channel D_ch is low (L) and a voltage on the channel D_chB is high (H).

Since NMOS transistor 315a is turned on, a voltage at first node 311a is pulled down to the ground voltage VSS. Thus, NMOS transistor 367a maintains an off state. However, since NMOS transistor 317a maintains an off state, a voltage at third node 313a is maintained at the first supply voltage VDDQ.

Thus, since NMOS transistor 369a is turned on, a current introduced by the second supply voltage VDD is discharged to ground voltage VSS through a resistor R, and NMOS transistors 369a and 373a. Consequently, a theoretical voltage ("$V_{351a}$") apparent at third node 351a is expressed as follows:

$$V351a = VDD - 0.5i_1 R \quad (1)$$

NMOS transistor 357a maintains an off state in response to the voltage (L) at pad 301a. Thus, voltage $V_{351a}$ is given by Equation 1 above. Since NMOS transistor 359a is turned on in response to the voltage (H) at pad 303a, a current introduced by second supply voltage VDD is discharged to ground voltage VSS through the resistor R, and NMOS transistors 359a and 363a. Consequently, a theoretical voltage ("$V_{353a}$") apparent at first node 353a is expressed as follows:

$$V353a = VDD - i_1 R \quad (2)$$

Therefore, referring to Equations 1 and 2, the voltage at third node 351a is higher than the voltage at first node 353a. As a result, data Din1 is detected as high (H) and data Din1B is detected as low (L). Thus, first SBD transceiver 350a detects the data Dout2 and Dout2B output by second SBD transceiver 350b.

Since an NMOS transistor 315b is turned on, a voltage at a first node 311b is pulled down to the ground voltage VSS. Thus, the NMOS transistor 367b maintains an off state. However, since the NMOS transistor 317b maintains an off state, a voltage at third node 313b is maintained at the first supply voltage VDDQ.

As a result, since NMOS transistor 369b is turned on, a current introduced by second supply voltage VDD is discharged to ground voltage VSS through the resistor R, and NMOS transistors 369b and 373b. Consequently, a theoretical voltage ("$V_{351b}$") apparent at third node 351b is expressed as follows:

$$V351b = VDD - 0.5i_1R \quad (3)$$

NMOS transistor 357b maintains an off state in response to the voltage (L) at pad 301b. Thus, voltage $V_{351b}$ is given by Equation 3 above. Since NMOS transistor 359b is turned on in response to the voltage (H) at pad 303b, a current introduced by second supply voltage VDD is discharged to ground voltage VSS through resistor R, and NMOS transistors 359b and 363b. Consequently, a theoretical voltage ("$V_{353b}$") apparent at first node 353b is expressed as follows:

$$V353b = VDD - i_1R \quad (4)$$

Therefore, referring to Equations 3 and 4, voltage $V_{351b}$ is higher than the voltage $V_{353b}$. As a result, data Din2 is detected as high (H) and data Din2B is detected as low (L). Thus, second SBD transceiver 350b detects the data Dout1 and Dout1B output by first SBD transceiver 350a.

When the data Dout1 and Dout2B to be output are high (H) and the data Dout1B and Dout2 to be output are low (L), the operation of first SBD transceiver 350a and second SBD transceiver 350b are as follows.

Since NMOS transistor 335a is turned on in response to the data Dout1 (H), the voltage at first node 331a is low (L). Thus, the voltage at pad 301a is low (L). However, since NMOS transistor 337a maintains an off state in response to the data Dout1B (L), the voltage at node third 333a is high (H). Thus, the voltage at pad 303a is high (H).

Since NMOS transistor 335b maintains an off state in response to the data Dout2 (L), the voltage at first node 331b is high (H). Thus, the voltage at pad 301b is high (H). However, since NMOS transistor 337b is turned on in response to the data Dout2B (H), the voltage at third node 333b is low (L). Thus, the voltage at pad 303b is low (L).

Therefore, since the voltage on channel D_ch connected between pad 301a and pad 301b is formed through an overlap between voltages output from first SBD transceiver 350a and second SBD transceiver 350b, it corresponds to a mid-level (M) between a high (H) level and a low (L) level.

Also, since the voltage on channel D_chB connected between pad 303a and pad 303b is formed through an overlap between voltages output from first SBD transceiver 350a and second SBD transceiver 350b, it corresponds to a mid-level (M) between a high (H) level and a low (L) level.

Since the respective outputs of NMOS transistors 357a and 359a are identical, the data Din1 and Din1B are determined by the respective voltages at third node 313a and first node 311a.

Since NMOS transistor 315a is turned on in response to the data Dout1 (H), the voltage at first node 311a is low (L). Thus, NMOS transistor 367a maintains an off state. Consequently, a theoretical voltage ("$V_{353a}$") apparent at first node 353a is expressed as follows:

$$V353a = VDD - 0.5i_1R \quad (5)$$

However, since NMOS transistor 317a maintains an off state in response to the data Dout1B(L), the voltage at third node 313a is high (H). Thus, NMOS transistor 369a is turned on. Consequently, the theoretical voltage ("$V_{351a}$") apparent at third node 351a is expressed as follows:

$$V351a = VDD - 0.5i_1R - 0.5i_1R = VDD - i_1R \quad (6)$$

As a result, the data Din1 is detected as low (L) and the data Din1B is detected as high (H). Thus, first SBD transceiver 350a detects the data Dout2 and Dout2B output by second SBD transceiver 350b.

Since the respective outputs of NMOS transistors 357b and 359b are identical, the data Din2 and Din2B are determined by the voltages respectively apparent at third node 313b and first node 311b.

Since NMOS transistor 317b is turned on in response to the data Dout2B (H), the voltage at third node 313b is low (L). Thus, NMOS transistor 369b maintains an off state. Consequently, the theoretical voltage ("$V_{351b}$") apparent at third node 351b is expressed as follows:

$$V351b = VDD - 0.5i_1R \quad (7)$$

However, since NMOS transistor 315b maintains an off state in response to the data Dout2(L), the voltage at first node 311b is high (H). Thus, NMOS transistor 367b is turned on. Consequently, the theoretical voltage ("$V_{353b}$") apparent at first node 353b is expressed as follows:

$$V353b = VDD - 0.5i_1R - 0.5i_1R = VDD - i_1R \quad (8)$$

Thus, the data Din2 is detected as high (H) and the data Din2B is detected as low (L). Therefore, second SBD transceiver 350b detects the data Dout1 and Dout1B output by first SBD transceiver 350a.

When the data Dout1 and Dout2 to be output are low (L) and the data Dout1B and Dout2B to be output are high (H), the operations of first SBD transceiver 350a and the second SBD transceiver 350b are as follows.

Since NMOS transistor 337a is turned on in response to the data Dout1B (H), the voltage at third node 333a is low (L). Thus, the voltage at pad 303a is low (L). At this time, the voltage at pad 301a is high (H).

Since NMOS transistor 337b is turned on in response to the data Dout2B (H), the voltage at third node 333b is low (L). Thus, the voltage at pad 303b is low (L). At this time, the voltage at pad 301b is high (H). Consequently, the voltage on the channel D_ch is high (H) and the voltage on the channel D_chB is low (L).

Since NMOS transistor 317a is turned on in response to the data Dout1B (H), the voltage at third node 313a is low (L) and NMOS transistor 369a is turned off. However, since NMOS transistor 315a maintains an off state, the voltage at first node 311a is high (H). Thus, NMOS transistor 367a is turned on.

A current introduced by second supply voltage VDD flows toward ground voltage VSS through resistor R, and NMOS transistors 367a and 373a. Consequently, the theoretical voltage ("$V_{353a}$") apparent at the node 353a is expressed as follows:

$$V353a = VDD - 0.5i_1R \quad (9)$$

Since NMOS transistor 357a is turned on in response to the voltage (H) at the pad 301a, the current introduced by second supply voltage VDD flows toward ground voltage VSS through resistor R, and NMOS transistors 357a and 363a. Consequently, the theoretical voltage ("$V_{351a}$") apparent at the node 351a is expressed as follows:

$$V351a = VDD - i_1R \quad (10)$$

As a result, the data Din1 is detected as low (L) and the data Din1B is detected as high (H). Thus, first SBD transceiver 350a detects the data Dout2 and Dout2B output by second SBD transceiver 350b.

Since NMOS transistor 317b is turned on in response to the data Dout2B (H), the voltage at third node 313b is low (L) and NMOS transistor 369b is turned off. However, since NMOS transistor 315b maintains an off state, the voltage at first node 311b is high (H). Thus, NMOS transistor 367b is turned on.

A current introduced by second supply voltage VDD flows toward ground voltage VSS through resistor R, and NMOS transistors 367b and 373b. Consequently, the theoretical voltage ("$V_{353b}$") apparent at the node 353b is expressed as follows:

$$V353b = VDD - 0.5i_1R \quad (11)$$

Since NMOS transistor 357b is turned on in response to the voltage (H) at pad 301b, the current introduced by second supply voltage VDD flows toward ground voltage VSS through resistor R, and NMOS transistors 357b and 363b. Consequently, the theoretical voltage ("$V_{351b}$") apparent at the node 351b is expressed as follows:

$$V351b = VDD - i_1R \quad (12)$$

As a result, the data Din2 is detected as low (L) and the data Din2B is detected as high (H). Thus, second SBD transceiver 350b detects the data Dout1 and Dout1B output by first SBD transceiver 350a.

FIGS. 5A through 5D are voltage waveform diagrams showing the relationship between input data and output data from first SBD transceiver 350a and second SBD transceiver 350b of FIG. 4.

The above description with reference to FIG. 4 corresponds to a case where ideal SBD transceivers are connected through an ideal channel. However, in practice, when signals output from first SBD transceiver 350a and second SBD transceiver 350b are transmitted over channels D_ch and D_chB, the signals are attenuated and/or distorted.

Here, when the voltages on channels D_ch and D_chB are high (H) and low (L), respectively, or when the voltages on channels D_ch and D_chB correspond to mid levels (M), signal margins for these two cases are different.

Figure 5A:
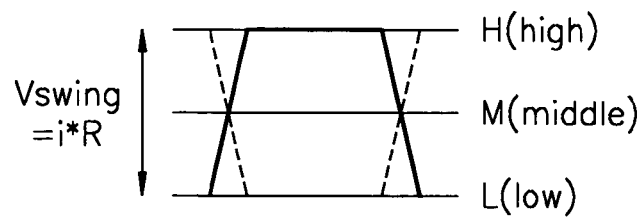
FIGS. 5A through 5D show the relationship between input data and output data of the SBD transceivers of FIG. 4.
Figure 5B:
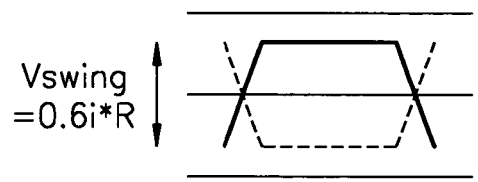
Figure 5C:
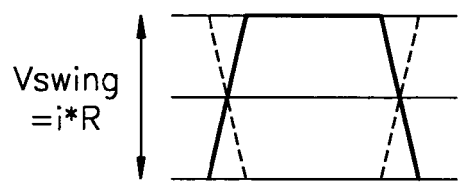
Figure 5D:
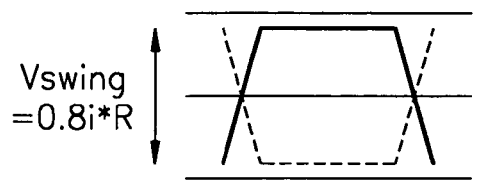

As shown in FIGS. 4 and 5A, when second SBD transceiver 350b outputs signals having voltage swing widths ("Vswing") of i*R on channels D_ch and D_chB, and signals applied to pads 301a and 303a through channels D_ch and D_chB have Vswing of 0.6i*R, then Vswing of the signals applied to pads 301a and 303a are actually 0.8i*R due to effects of output signals (see, FIG. 5C) of first differential amplifier 310 shown in FIG. 3. As a result, the signal margin of the input buffer (see element 350 in FIG. 3) is reduced.

Figure 6:
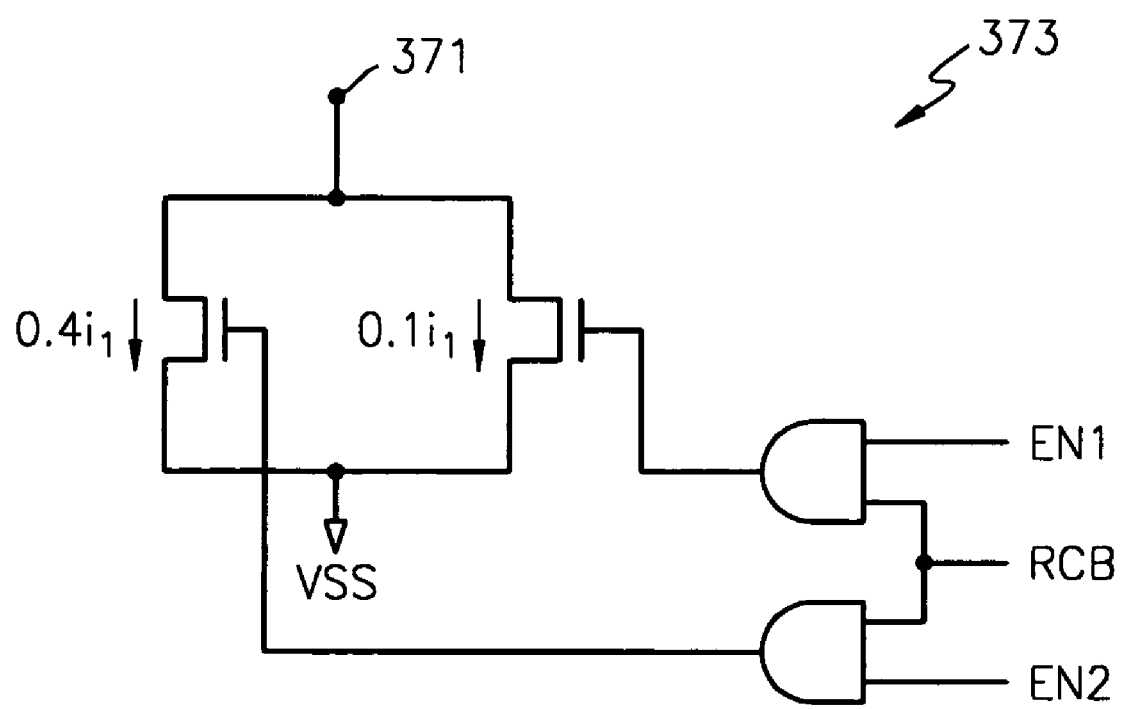
FIG. 6 illustrates one preferred embodiment for one or more of the current sources shown in FIG. 3.

FIG. 6 illustrates a presently preferred embodiment of fourth constant current source 373 of FIG. 3. The circuit shown in FIG. 6 is used to compensate for reduction of the signal margin, where such margin, as apparent at the input buffer (350 of FIG. 3), is reduced. For instance, the signal voltage swing widths for signal applied to channels D_ch and D_chB are reduced to 60%, if a transistor through which current $0.1i_1$ flows is disabled, the margins for high signals and low signals can be made identical.

Referring to FIG. 6, the transistor through which current $0.1i_1$ flows is turned on in response to a signal resulting from performing an AND operation on the receiving bias signal RCB and a first enable signal EN1, and a transistor through which current $0.4i_1$ flows is turned on in response to a signal resulting from performing an AND operation on the receiving bias signal RCB and a second enable signal EN2.

As described above, an SBD transceiver according to the present invention can reduce power consumption. Also, since the SBD transceiver according to the present invention allows reduction in the relative size of an output buffer, parasitic capacitance is reduced. Accordingly, the SBD transceiver can stably operate at higher data transmission frequencies.

While the present invention has been particularly shown and described with reference to certain presently preferred embodiments, it will be understood by those of ordinary skill in the art that various changes in form and details may be made therein without departing from the spirit and scope of the invention as defined by the appended claims and their equivalents.

What is claimed is:

1. A simultaneous bi-directional (SBD) transceiver comprising:
   a first differential amplifier, comprising; a first pair of input terminals, a first pair of output terminals, and a first constant current source communicating a first current;
   a second differential amplifier, comprising; a second pair of input terminals, a second pair of output terminals, and a second constant current source communicating a second current twice as large as the first current;
   a third differential amplifier, comprising; a third pair of input terminals, a third pair of output terminals, and a third constant current source communicating a third current; and
   a fourth differential amplifier, comprising a fourth pair of input terminals, a fourth pair of output terminals, and a fourth constant current source communicating a fourth current, wherein the third current is twice as large the fourth current,
   wherein the first pair of input terminals is connected terminal-for-terminal with the second pair of input terminals;
   wherein the first pair of output terminals is connected terminal-for-terminal with the fourth pair of input terminals;
   wherein the second pair of output terminals is connected terminal-for terminal with the third pair of input terminals; and,
   wherein the third pair of output terminals is connected terminal-for terminal with the fourth pair of output terminals.

2. The SBD transceiver of claim 1, wherein a load resistance associated with the first differential amplifier is substantially equal to a load resistance associated with the second differential amplifier.

3. The SBD transceiver of claim 1, wherein the third pair of input terminals is connected terminal-for terminal to corresponding first and second data transmission channels.

4. The SBD transceiver of claim 3, wherein the first and second data transmission channels are complementary data transmission channels.

5. A simultaneous bi-directional (SBD) transceiver comprising:
   a first differential amplifier, comprising:
   a first differential pair comprising a first transistor having a gate receiving a first input signal and a second transistor having a gate receiving a second input signal,
   a first constant current source connected between a ground voltage and a node commonly connected to sources of the first and second transistors,
   a first load resistor connected between a first supply voltage and a drain of the first transistor, and
   a second load resistor connected between the first supply voltage and a drain of the second transistor;

a second differential amplifier, comprising:
  a second differential pair comprising; a third transistor having a gate connected to the gate of the first transistor, and a fourth transistor having a gate connected to the gate of the second transistor,
  a second constant current source connected between the ground voltage and a node commonly connected to sources of the third transistor and the fourth transistor,
  a third load resistor connected between the first supply voltage and a drain of the third transistor, and
  a fourth load resistor connected between the first supply voltage and a drain of the fourth transistor;
a third differential amplifier, comprising;
  a third differential pair comprising; a fifth transistor having a gate receiving a third input signal, and a sixth transistor having a gate receiving a fourth input signal,
  a third constant current source connected between the ground voltage and a node commonly connected to the sources of the fifth and sixth transistors; and,
a fourth differential amplifier, comprising;
  a fourth differential pair comprising; a seventh transistor having a gate connected to the drain of the first transistor, and an eighth transistor having a gate connected to the drain of the second transistor,
  a fourth constant current source connected between the ground voltage and a node commonly connected to sources of the seventh and eighth transistors,
  a fifth load resistor connected between the second supply voltage and a drain of the seventh transistor, and
  a sixth load resistor connected between the second supply voltage and a drain of the eighth transistor.

6. The SBD transceiver of claim 5, wherein a second current flowing through the second constant current source is "n" times, where "n" is a positive value, that of a first current flowing through the first constant current source.

7. The SBD transceiver of claim 6, wherein a third current flowing through the third constant current source is "m" times, "m" is a positive value, that of a fourth current flowing through the fourth constant current source.

8. The SBD transceiver of claim 7, wherein "n" and "m" are both equal to 2.

9. The SBD transceiver of claim 5, wherein when the first constant current source, the second constant current source, the third constant current source, and the fourth constant current source are implemented as NMOS transistors;
  wherein a first bias voltage is supplied to gates of the first and second constant current sources, and
  wherein a second bias voltage is supplied to gates of the third and fourth constant current sources.

10. The SBD transceiver of claim 5, wherein the gate of the fifth transistor is connected to a first channel and receives the third input signal via the first channel, and the gate of the sixth transistor is connected to a second channel and receives a fourth input signal via the second channel.

11. A simultaneous bi-directional (SBD) transceiver comprising:
  a first differential amplifier, comprising a first constant current source communicating a first current, amplifying a difference between first differential input signals, and outputting first differential output signals;
  a second differential amplifier, comprising a second constant current source communicating a second current twice the first current, amplifying a difference between the first differential input signals, and outputting second differential output signals;
  a third differential amplifier, comprising a third constant current source communicating a third current, and amplifying a difference between signals applied through a pair of input terminals; and
  a fourth differential amplifier, comprising a fourth constant current source communicating a fourth current, wherein the third current is twice the fourth current, and amplifying a difference between the first differential output signals,
  wherein the second differential output signals are input to the pair of input terminals, and output signals derived from the third differential amplifier overlap output signals derived from the fourth differential amplifier.

12. First and second simultaneous bi-directional (SBD) transceivers connected via a first and second data transmission channels, wherein each of the first and second SBD transceivers comprises:
  first, second, third and fourth differential amplifiers, each comprising a respective first, second, third and fourth constant current sources, wherein the second current source is twice as large as the first current source, and the third current source is twice as large as the fourth current source;
  wherein the first and second differential amplifiers are fully differential amplifiers commonly receiving input signals;
  wherein the third differential amplifier responds to signals input through the first and second data transmission channels; and,
  wherein the fourth differential amplifier responds to output signals derived from the first differential amplifier in response to the input signals.

* * * * *